United States Patent [19]
Fisch

[11] Patent Number: 5,231,308
[45] Date of Patent: Jul. 27, 1993

[54] CONTROL DEVICE FOR CONTROLLING FUNCTIONS IN A MOTOR VEHICLE

[75] Inventor: Alfons Fisch, Falkenstein, Fed. Rep. of Germany

[73] Assignee: Siemens Aktiengesellschaft, Munich, Fed. Rep. of Germany

[21] Appl. No.: 618,644

[22] Filed: Nov. 27, 1990

[30] Foreign Application Priority Data

Nov. 28, 1989 [EP] European Pat. Off. ......... 89121923.0

[51] Int. Cl.$^5$ .......................... B60L 1/00; H05K 9/00
[52] U.S. Cl. .................. 307/10.1; 174/35 R; 361/399; 361/424
[58] Field of Search ...... 307/9.1, 10.1, 10.3, 307/10.6; 361/414, 416, 412, 399, 424, 395; 174/261, 35 R, 51; 439/108; 357/84

[56] References Cited

U.S. PATENT DOCUMENTS

| | | | |
|---|---|---|---|
| 4,218,578 | 8/1980 | Olschewski et al. | 174/35 R |
| 4,668,873 | 5/1987 | Ohba et al. | 307/9.1 |
| 4,967,316 | 10/1990 | Goebel et al. | 361/424 |
| 5,019,945 | 5/1991 | Smolley | 361/412 |
| 5,053,926 | 10/1991 | Dickie | 361/424 |

FOREIGN PATENT DOCUMENTS 8715073.5  4/1988  Fed. Rep. of Germany.

OTHER PUBLICATIONS

Bulletin, 903 Machine Design 56 (1984) Sep. 6, No. 20, Cleveland, Ohio, USA "Minimizing Noise in Digital PCB Layouts". pp. 144 & 146.

*Primary Examiner*—A. D. Pellinen
*Assistant Examiner*—Richard T. Elms
*Attorney, Agent, or Firm*—Hill, Steadman & Simpson

[57] ABSTRACT

In a control device having an analog part and a digital part, an analog ground plane layer is provided for the analog part and a digital ground plane layer is provided for the digital part, these ground plane layers being separately connected to a conductive base plate of the control device to which a grounding line is also connected. This reduces emissions via the ground line and the shield of the signal line caused by high frequency switching events in the digital part.

11 Claims, 1 Drawing Sheet

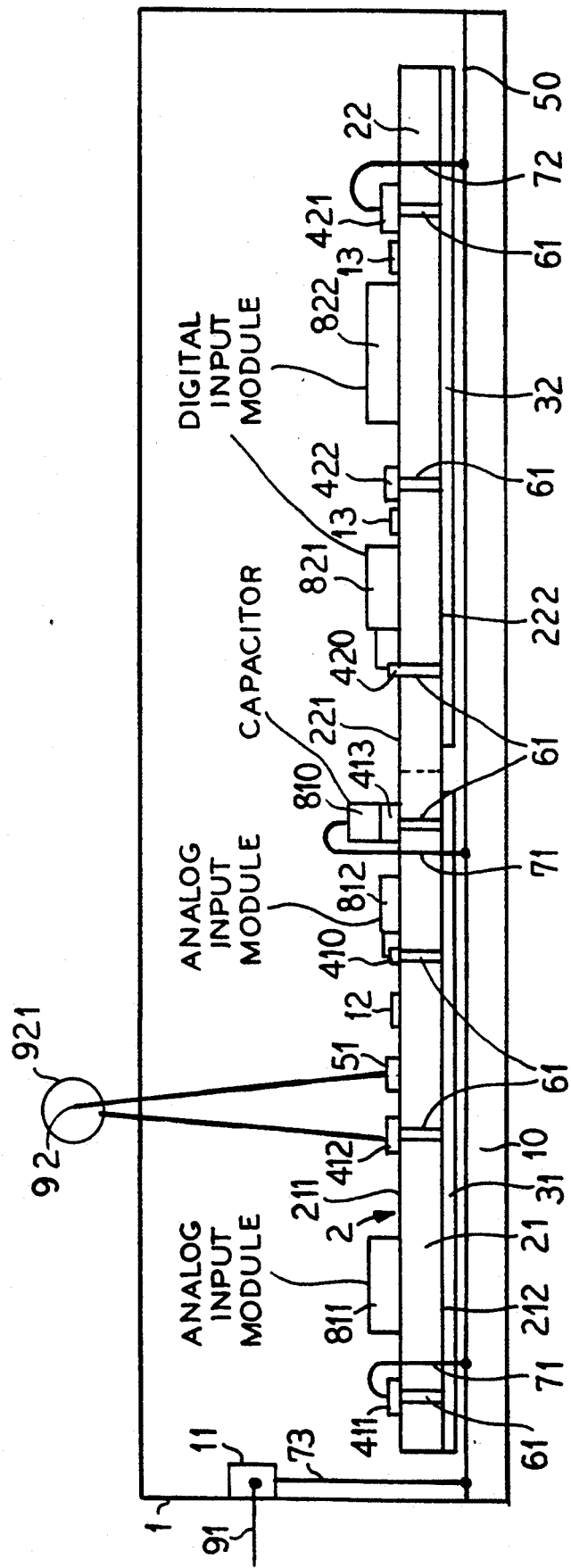

CONTROL DEVICE FOR CONTROLLING FUNCTIONS IN A MOTOR VEHICLE

BACKGROUND OF THE INVENTION

1. Field of the Invention

The present invention relates generally to a control device having both analog and digital portions and, more particularly, to a grounding arrangement for such control device.

2. Description of the Related Art

A control device is disclosed in German Utility Model 87 15 073.5.

This control device has analog modules and digital modules that are arranged on a carrier plate. The upper side of the carrier plate has printed connecting lines for the modules, terminal contacts for connection to signal lines, and terminal points to ground. A planar grounding layer to which the grounding terminal points on the upper side are connected over the shortest path is arranged on the lower side of the carrier plate. Connectors that pass through holes in the carrier plate serve this purpose, so that extremely low impedance connections to ground are provided.

Despite the advantageous structure of this known device, a high frequency emission which proves disturbing in some cases has been measured at such control devices. This is particularly true in the case when lines leading from the control device, and in particular the grounding line, forms a cable tree together with other lines that lead to other electronic devices. A very tight coupling between a number of devices which can lead to mutual disturbances thereby arises.

SUMMARY OF THE INVENTION

An object of the present invention is to provide a control device in which disturbing emissions from the control device are reduced relative to the prior art devices.

This and other objects and advantages of the invention are achieved by a control device which includes an analog part for editing an input signal, the analog part having a first plate part with an upper side and a lower side that includes a planar sub-ground forming an analog ground on its lower side and that includes analog input modules, printed connecting lines, a terminal contact for a signal line, and grounding terminal points on its upper side. The grounding terminal points are connected to the analog ground through holes in the plate part over the shortest path and in particular for the connection of a shield or ground lead of the signal line. A digital part of the control device is also provided for acquiring a control signal from the input signal, the digital part having at least one plate part with an upper side and a lower side that includes a planar grounding layer in the form a digital ground on its lower side, and on its upper side is provided with digital modules including a microprocessor and at least one peripheral digital module, printed connecting lines including a data bus and an address bus, and grounding terminal points. The grounding terminal points are connected through holes in the plate part to the digital ground over the shortest path. Also provided is an electrically conductive base plate which carries the plate parts and to which at least one of the grounding terminal points of the analog part and one of the grounding terminal points of the digital part are connected spatially separated from one another, as well as including a grounding post for the connection of a grounding line.

The invention essentially provides at least two plate parts with respective planar ground layers, an analog ground layer and a digital ground layer, which are electrically insulated from one another. All "fast" digital components of the control device, such as processors and memories, are arranged on the plate part having the digital ground. These "fast" digital components are characterized by the processing of signals having steep signal edges and/or high clock frequencies. In particular, steep signal edges may be defined as those signal edges spanning less than one micro second, and high clock frequencies may be defined as clock frequencies of greater than 500 kHz. The analog ground layer is separated from the digital ground layer and is allocated to the analog part and has the signal line and the signal line shielding connected thereto. The analog ground layer and the digital ground are then connected to an electrically conductive base plate for the control device at locations spatially separated from one another, and a grounding line from outside the device is connected to the base plate.

The present invention is based on the discovery that, in the known technology, a high frequency difference in potential occurs between the base plate, on the one hand, and the planar ground layer and parts electrically connected thereto, such as the grounding terminal line and the signal line shield, on the other hand. This high frequency difference is then emitted via these lines as radio frequency disturbances. The pulse currents in the digital part, for example between a microprocessor and a memory "EPROM", have been identified as a cause of this noise voltage. These pulse currents have extremely high frequency components that already produce disturbing voltage drop-offs and short grounding terminal lines and the base plate due to the shallow penetration depth. This noise emission can be drastically reduced with the present inventive separation of the digital ground from the analog ground part since this results in practically no high frequency coupling between these two grounds.

Within the framework of the invention, the plate portion having the digital ground can form a separate carrying plate which carries the digital modules on its upper side. It is usually more advantageous, however, when both plate parts form a one piece carrying plate on whose under side the analog ground and digital ground are arranged side-by-side but electrically separated from one another.

BRIEF DESCRIPTION OF THE DRAWINGS

The FIGURE is a cross-section through a control device showing an exemplary embodiment according to the principles of the present invention.

DETAILED DESCRIPTION OF THE PREFERRED EMBODIMENTS

A control device 1, which in the illustrated example is an ignition control device for a motor vehicle, has an electrically conductive base plate 10. A one-piece carrying plate 2 which is formed of, for example, a ceramic substrate, is divided into two sub-regions, namely a first plate part 21 and a second plate part 22. The first plate part 21 has an upper side 211 and a lower side 212, while the second plate part 22 has an upper side 221 and a lower side 222.

On the upper side 211 of the first plate part 21 are provided a plurality of analog input modules 811 and 812 of the analog portion of the device, a printed circuit 12 for connecting the input modules to one another, to a terminal contact 51 and to grounding terminal points 410-413. All grounding terminal points 410-413 are connected to an analog ground layer 31 on the lower side 212 of the first plate part 21 via connectors 61 which are conducted through holes in the first plate part 21. A signal line 92, which carries a signal from, for example a rotary sensor, is connected to the terminal contact 51, and the shield 921 for the signal line 92 is connected to a grounding terminal point 412. The illustrated signal line 92 is a co-axial line and the shield 921 is the ground portion thereof. The grounding terminal point 410, for example, provides a short grounding connection to the input module 812.

On the underside 222 of the second plate part 22 is a planar ground layer 32 serving as a digital ground. On the upper side 221 of the second plate part 22 is mounted all of the "fast" digital modules 821 and 822 of the control device, such as, for example, a microprocessor and at least one peripheral digital module such as an EPROM. The digital modules are connected to one another by printed circuits, such as the printed circuits 13, forming an address bus and a data bus. A plurality of connectors 61 extending through holes in the plate part 22 serve to connect the digital ground 32 to grounding terminal points 420-422 on the upper side 221 of the second plate part 22. The grounding terminal point 420 provides a short connection between the digital module 821 and the digital ground layer 32, for example, and also short connections between the digital ground 32 and points on the printed circuit 13.

In at least one location, the analog ground 31 and the digital ground 32 are provided with a DC conductive connection to different points of the electrically conductive base plate 10. This connection is made by a grounding terminal point 411 and a connecting line or bond wire 71 and via a grounding terminal point 421 and a connecting line 72. A connecting line 73 is provided between the electrically conductive base plate 10 and a ground post 11 for connection to an external grounding line 91. The amplitude of the residual interference voltage acting between the base plate 10 and the analog ground 31 depends upon the number of connections between the base plate 10 and the analog ground 31. This residual interference voltage also is present between the grounding line 91 and the shield 921.

Especially good results are achieved when the analog ground is sub-divided into a number of surface regions, each of which is connected via an appertaining grounding terminal point and a connecting line to the closest terminal point of the base plate 10. It is usually expedient to provide only one of the connections as a DC conductive connection while the others are capacitively connected. In the FIGURE, a capacitor 810 having a capacitance value of 22 $\mu$F is soldered between the grounding terminal point 413 and the connecting lines 71, for example. Such capacitors prevent disturbances due to spatial distribution of direct currents of a power stage, for example of an ignition input stage, on the input part. As an alternate embodiment, the digital part may be arranged distributed into two sub-plates having allocated digital grounds, wherein one plate part is formed as a one-piece carrying plate together with the plate part allocated to the analog part. This one piece carrying plate has two grounding surfaces, an analog ground and a digital ground, insulated from one another on its lower side.

The carrying plate or plate parts are preferably secured to the base plate 10 with an adhesive 50.

Thus there is shown and described a control device, such as for use in controlling the functions of a motor vehicle, having an analog part and a digital part. High-frequency switching events in the digital part cause radio frequency disturbances that are emitted via the ground line 91 and the shield of the signal line 92. The present invention reduces this emission by providing an analog ground plane and a digital ground plane which are electrically insulated from one another and are allocated to the respective analog part and digital part of the control device. Each of these ground planes are separately connected to a conductive base plate of the control device to which the grounding line is also connected.

Although other modifications and changes may be suggested by those skilled in the art, it is the intention of the inventor to embody within the patent warranted hereon all changes and modifications as reasonably and properly come within the scope of his contribution to the art.

I claim:

1. A control device connectable to a signal line carrying an input signal and a ground line, comprising:
   an analog part for editing the input signal, said analog part including
      a first plate part having an upper side and a lower side and holes extending through said first plate part from said upper side to said lower side,
      a planar ground layer as an analog ground on said lower side of said first plate part,
      analog input modules, printed connecting lines, a terminal contact for the signal line, and grounding terminal points all on said upper side of said first plate part,
      means for connecting said grounding terminal points to said analog ground through said holes in said first plate part over a path of generally shortest distance;
   a digital part for acquiring a control signal from said input signal, said digital part including
      at least one second plate part having an upper side and a lower side and holes extending through said at least one second plate part from said upper side to said lower side,
      a planar grounding layer as a digital ground on said lower side of said at least one second plate part,
      digital modules including a microprocessor and at least one peripheral digital module, printed connection lines including a data and address bus, and grounding terminal points on said upper side,
      means for connecting said grounding terminal points to said digital ground through said holes in said at least one second plate part over a path of generally shortest distance;
   an electrically conductive base plate carrying said first plate part and said at least one second plate part;
   a grounding post connected to said base plate for connecting to the grounding line; and
   means connecting at least one of said grounding terminal points of said analog part and at least one said grounding terminal points of said digital part to said base plate spatially separated from one another.

2. A control device as claimed in claim 1, further comprising:
means for connecting a shield of said signal line to one of said grounding terminal points of said analog part.

3. A control device as claimed in claim 1, wherein said control device is constructed and adapted for controlling functions of a motor vehicle.

4. A control device as claimed in claim 1, wherein said first plate part of said analog part and said at least one second plate part of said digital part form a one-piece carrying plate being a printed circuit board having said planar analog and digital ground layers on an underside thereof separated from one another.

5. A control device as claimed in claim 1, wherein said first plate part of said analog part has a plurality of said grounding terminal points spatially distant from one another, and further comprising:
means for capacitively connecting ones of said grounding terminal points of said analog part to said base plate over a generally shortest path.

6. A grounding arrangement for a control device having an analog circuit portion and a digital circuit portion, comprising:
a first plate supporting said analog circuit portion on an upper side of said first plate;
a second plate supporting said digital circuit portion on an upper side of said second plate;
an analog ground layer on an under side of said first plate;
means for connecting said analog circuit portion to said analog ground layer through said first plate;
a digital ground layer on an under side of said second plate;
means for connecting said digital circuit portion to said digital ground layer through said second plate;
a base plate connectable to an external ground;
means for connecting said analog circuit portion to said base plate at a first location; and
means for connecting said digital circuit portion to said base plate at a second location remote from said first location.

7. A grounding arrangement as claimed in claim 6, wherein said first plate is formed in one piece with said second plate, and said analog ground layer is separate from said digital ground layer.

8. A grounding arrangement as claimed in claim 6, wherein said means for connecting said analog circuit portion to said base plate comprises a grounding terminal point formed on said upper side of said first plate and a connecting line connected between said grounding terminal point and said base plate, and
wherein said means for connecting said digital circuit portion to said base plate comprises a grounding terminal point formed on said upper side of said second plate and a connecting line connected between said grounding terminal line and said base plate.

9. A grounding arrangement as claimed in claim 8, wherein said means for connecting said analog circuit portion to said base plate further comprises at least one capacitive connection between said upper side of said first plate and said base plate.

10. A grounding arrangement as claimed in claim 6, further comprising:
means for connecting said upper side of said first plate to a signal line,
means for connecting said under side of said first plate to a ground shield of the signal line, and
means for connecting said base plate to an external ground line.

11. A grounding arrangement as claimed in claim 6, wherein said first plate and said second plate are mounted on said base plate.

* * * * *